(12) United States Patent
Quax

(10) Patent No.: US 12,205,950 B2
(45) Date of Patent: Jan. 21, 2025

(54) GUARD REGION FOR AN INTEGRATED CIRCUIT

(71) Applicant: NXP B.V., Eindhoven (NL)

(72) Inventor: Guido Wouter Willem Quax, Wijchen (NL)

(73) Assignee: NXP B.V., Eindhoven (NL)

( * ) Notice: Subject to any disclaimer, the term of this patent is extended or adjusted under 35 U.S.C. 154(b) by 484 days.

(21) Appl. No.: 17/657,894

(22) Filed: Apr. 4, 2022

(65) Prior Publication Data

US 2023/0317726 A1  Oct. 5, 2023

(51) Int. Cl.
  H01L 27/02  (2006.01)
  H01L 27/07  (2006.01)
  H01L 27/092  (2006.01)

(52) U.S. Cl.
  CPC ...... H01L 27/0921 (2013.01); H01L 27/0255 (2013.01); H01L 27/0727 (2013.01)

(58) Field of Classification Search
  CPC ............ H01L 27/0255; H01L 27/0292; H01L 27/0921; H01L 27/0248–0296; H01L 23/60; H01L 29/87
  See application file for complete search history.

(56) References Cited

U.S. PATENT DOCUMENTS

| | | | |
|---|---|---|---|
| 6,919,604 B2 | 7/2005 | Lai et al. | |
| 7,566,595 B2 | 7/2009 | Steinhoff | |
| 8,492,873 B1 * | 7/2013 | Tan | H01L 21/761 257/532 |
| 8,587,071 B2 | 11/2013 | Tsai et al. | |
| 8,796,729 B2 | 8/2014 | Clarke et al. | |
| 10,170,476 B2 | 1/2019 | Chapman et al. | |
| 2004/0114287 A1 * | 6/2004 | Salling | H01L 27/0277 361/90 |
| 2015/0236090 A1 | 8/2015 | Ritter | |
| 2021/0305248 A1 * | 9/2021 | Wang | H01L 27/0207 |

FOREIGN PATENT DOCUMENTS

EP  2908346 A1  8/2015

OTHER PUBLICATIONS

Cerati, L., "Novel Technique to Reduce Latch-up Risk due to ESD Protection Devices in Smart Power Technologies", 2006 Electrical Overstress / Electrostatic Discharge Symposium, Sep. 10-15, 2006.
Chen, C., "Optimization Design on Active Guard Ring to Improve Latch-Up Immunity of CMOS Integrated Circuits", IEEE Transactions on Electron Devices, vol. 66, No. 4, Apr. 2019.

* cited by examiner

Primary Examiner — Eric A. Ward
(74) Attorney, Agent, or Firm — David G. Dolezal

(57) ABSTRACT

An integrated circuit includes a first semiconductor device with an N type region biased by a first terminal and a second semiconductor device with a second region. An N type guard region is located laterally between the N type region of the first semiconductor device and the second region. A P type region is isolated in the N type guard region and is biased by a second terminal. The N type guard region is either electrically coupled to the second terminal through a resistor circuit or is characterized as floating.

20 Claims, 8 Drawing Sheets

GUARD REGION FOR AN INTEGRATED CIRCUIT

BACKGROUND OF THE INVENTION

Field of the Invention

This invention relates in general to integrated circuits including guard regions in substrates.

Description of the Related Art

Some integrated circuits utilize guard regions for isolating semiconductor devices (e.g., transistors, diodes) of the integrated circuit during operation. Some guard regions prevent or inhibit current from flowing from one device to another device though the substrate during operation. During some conditions, such as during latch-up testing or during an electrostatic discharge (ESD) event, the guard regions may prevent latch-up or damage to the devices.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The Figures are not necessarily drawn to scale.

DETAILED DESCRIPTION

The following sets forth a detailed description of a mode for carrying out the invention. The description is intended to be illustrative of the invention and should not be taken to be limiting.

As disclosed herein, an integrated circuit includes a first semiconductor device with an N type region biased by a first terminal and a second semiconductor device with a second region. An N type guard region is located laterally between the N type region of the first semiconductor device and the second region. A P type region is isolated in the N type guard region and is biased by a second terminal. The N type guard region is either electrically coupled to the second terminal through a resistor circuit or is characterized as floating.

One advantage that may occur in some embodiments of such a guard region configuration as described above is that when the first terminal is at a lower voltage than the second terminal (e.g., during a negative current stress test), a parasitic thyristor may form within the guard regions and device regions to source by the second terminal, current pulled from the first terminal, and not source current by regions of the second semiconductor device. Accordingly, such a thyristor may increase the electron collection capability of the guard region configuration of an integrated circuit.

As used herein, the designation of a semiconductor region as an "N" or "P" or as "N type" or "P type" denotes the net conductivity dopant concentration of the region. An "N" or "N type" indicates that the region has a net N type conductivity dopant concentration (e.g., of phosphorous, arsenic) and a "P" or "P type" indicates that the region as a net P type conductivity dopant concentration (e.g., of Boron). The designations of "+," "−," or no designation of "+" or "−" next to the N or P indicates the relative net concentration of the conductivity dopant. A "+" indicates a higher net concentration than no designation of "+" or "−," and a "−" indicates a lower net concentration than no designation of "+" or "−." The net conductivity doping concentrations of these regions can be formed by one or more conductivity dopant ion implantation processes or formed in-situ during semiconductor material formation. In one embodiment, a region with a designation of "+" has a net conductivity dopant concentration of around $10^{20}$ per $cm^{-3}$. A region without a designation of "+" or "−" has a net conductivity dopant concentration between $10^{16}$-$10^{17}$ per $cm^{-3}$, and a region with a designation of "—" has a net conductivity dopant concentration of less than $10^{16}$ per $cm^{-3}$. However, these designations may represent other values in other embodiments.

Figure 1:
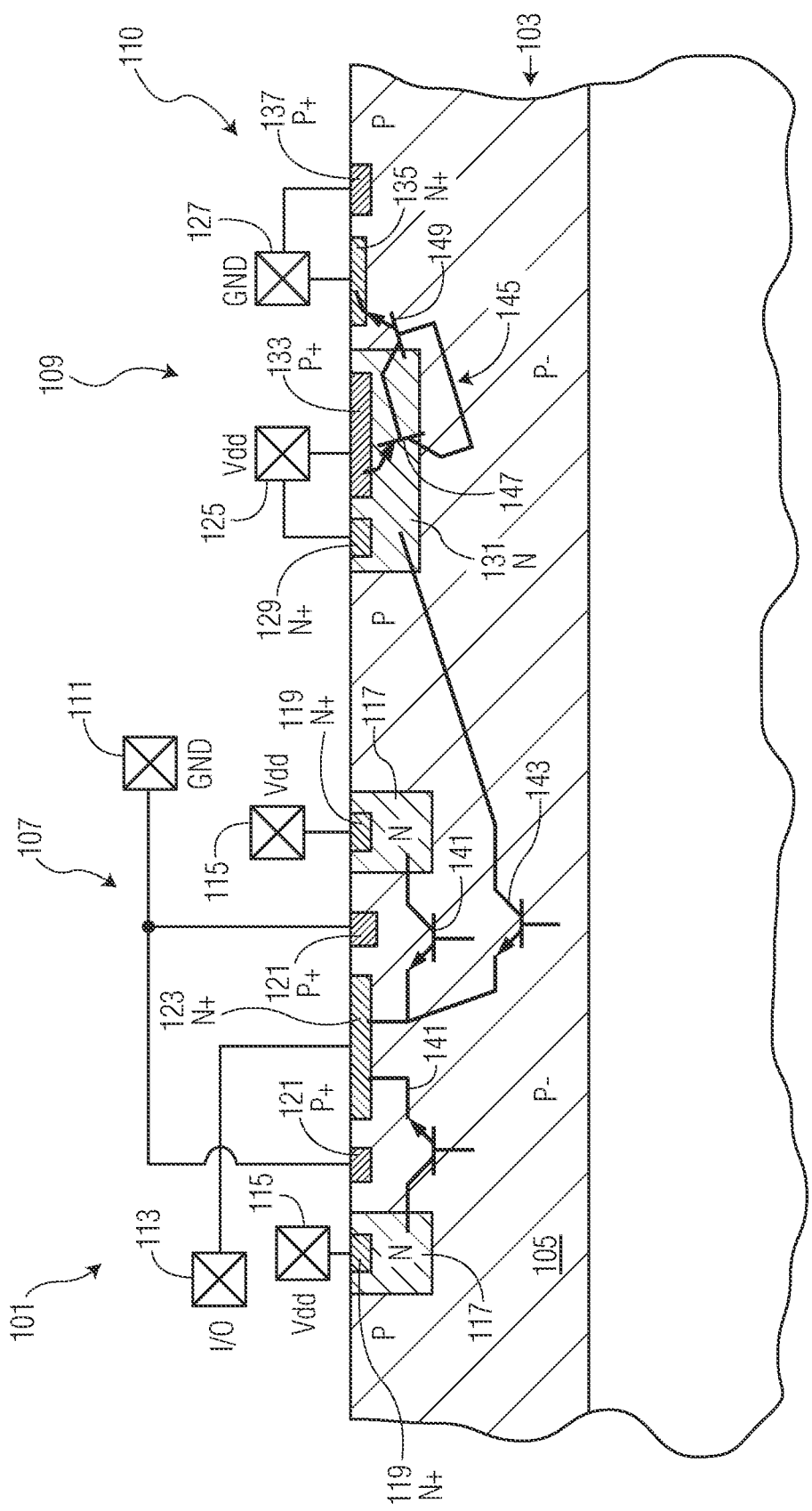
FIG. 1 is a partial cutaway side view of a prior art integrated circuit.

FIG. 1 is a partial cutaway sideview of a prior art integrated circuit 101. Integrated circuit 101 includes an NFET 107, PFET 109, and NFET 110. NFET 107 includes an N+ drain region 123 in a P layer region 105 of a semiconductor substrate 103. Region 123 is biased by an I/O pad terminal 113. A P+ contact region 121 laterally surrounds drain region 123 and is biased by ground (GND) terminal 111 to bias P layer region 105 at ground. An N guard region 117 laterally surrounds regions 121 and 123. N+ contact region 119 is located in N well region 117 and is biased by VDD terminal 115.

In FIG. 1, P layer region 105 is an epitaxial layer of P type material doped at a P− concentration and is subsequently selectively implanted with P type conductivity dopants at regions located closer to the surface to raise the P type net concentration to a "P" level.

Circuit 101 includes a PFET 109 and an NFET 110. An N type well region 131 for PFET 109 is located in P layer region 105. An N+ body bias contact region 129 is located in region 131 and is biased by VDD power supply terminal 125. PFET 109 includes a P+ source region 133 that is located in N well region 131 that is also biased by the VDD terminal 125. NFET 110 includes an N+ source region 135 located in P layer region 105 that is biased by ground terminal 127. Ground terminal 127 also biases P+ a body contact region 137 of NFET 110. Other regions of PFET 109 an NFET 110 are not shown in FIG. 1.

FIG. 1 shows transistor symbols of parasitic bipolar transistors that can form in substrate 103 during some operations of integrated circuit 101. For example, during a negative current injection stress test, a negative voltage (e.g. −1V) is applied to I/O terminal 113. With terminal 115 being biased at VDD (e.g., 1.8 V), and terminal 111 being biased at ground, a parasitic NPN transistor 141 forms in substrate 103 where N+ region 123 acts as an emitter, P layer region 105 as the base, and N guard region 117 as the collector for current to flow from terminal 115 through N+ contact region 119, N guard region 117, P layer region 105, N+ drain region 123 to the negatively biased terminal 113 so as to prevent latch-up or damage to integrated circuit 101 due to the test.

However, in some situations, not all current flowing to terminal 113 is sourced from terminal 115 through parasitic transistor 141. In the situation shown where terminal 125 is biased at VDD, a second parasitic NPN transistor 143 is formed in substrate 103 where N well region 131 acts as the collector, P layer region 105 as the base, and N+ drain region 123 as the emitter. When conductive during a negative stress test, transistor 143 acts to pull the voltage of well region 131 below the voltage of VDD, thereby forming a parasitic PNP transistor 147 where P+ source region 133 is the emitter (biased at VDD), N well region 131 is the base, and P layer region 105 (biased at ground) is the collector. The activation of transistor 147 pulls the portion of P layer region 105 located by N well region 131 above ground which cause a parasitic NPN transistor 149 to conduct where N+ source region 135 is the emitter, the above mentioned portion of P layer region 105 is the base, and N well region 131 is the collector. The conduction of parasitic transistor 149 further pulls N well region 131 below VDD which makes parasitic PNP transistor 147 more conductive to pull the portion of P layer region 105 higher to make parasitic NPN transistor 149 more conductive such that transistors 147 and 149 form a thyristor 145. Under some conditions, the activation of thyristor 145 can cause latch-up leading to integrated circuit inoperability or damage.

Figure 2:
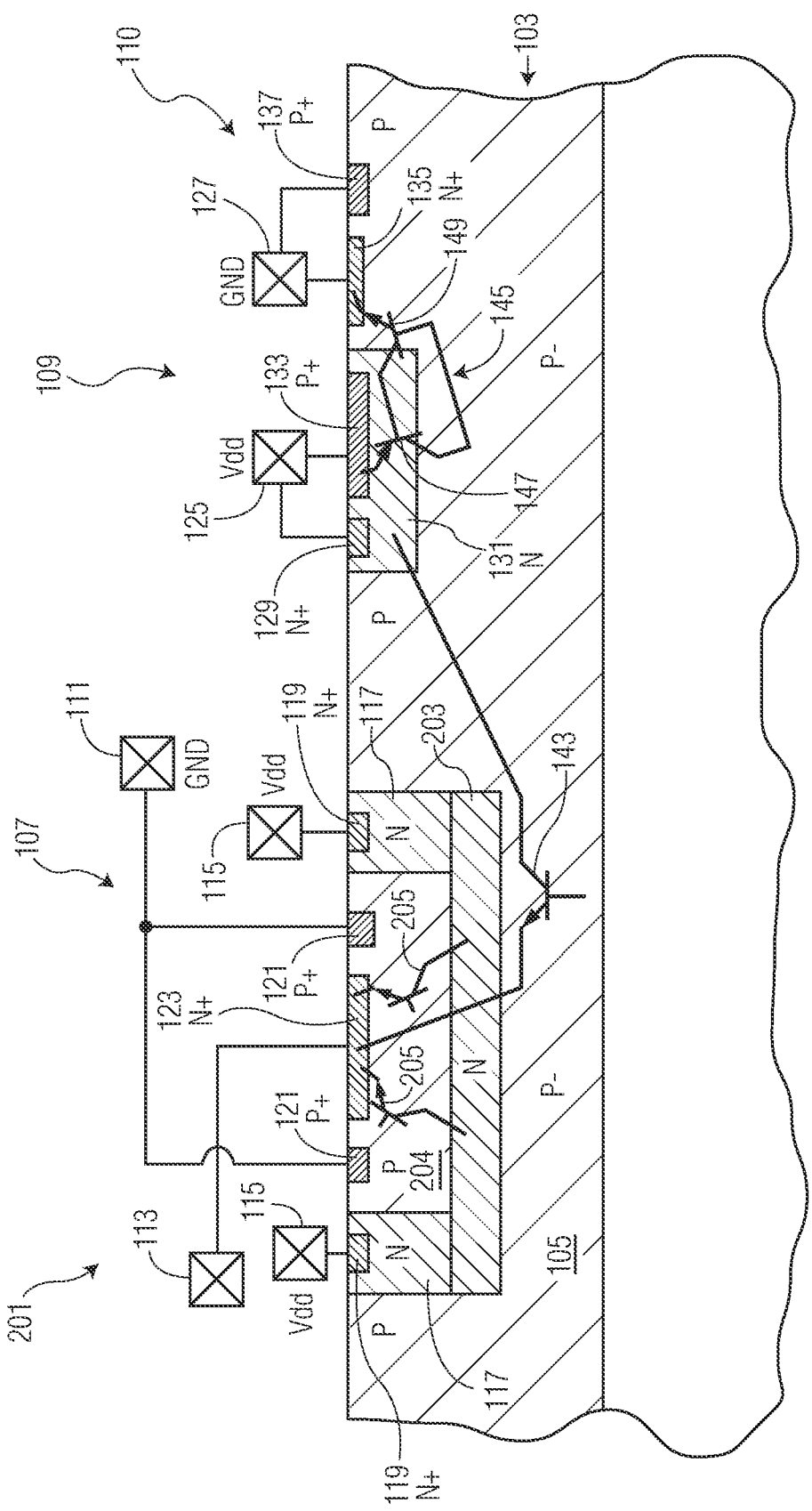
FIG. 2 is a partial cutaway side view of another prior art integrated circuit.

FIG. 2 is partial cutaway side view of another prior art integrated circuit 201. The items in FIG. 2 having the same reference numbers as in FIG. 1 are similar. Integrated circuit 201 is different from integrated circuit 101 in that it includes a buried N layer 203 below transistor 107. Layer 203 is in contact with N guard region 117. Layer 203 provides additional isolation during a negative stress test where an NPN transistor 205 forms with N+ drain region 123 as the emitter, P well 204 as the base, and buried N layer 203 as the collector to provide current from terminal 115 to terminal 113. However, even with the addition of layer 203, a sufficient amount of current may flow through parasitic transistor 143 to cause a thyristor 145 to form, thereby leading to similar latch-up problems as described in FIG. 1.

In other prior art examples, N guard region 117 may be grounded by connecting region 119 to a ground terminal. However, grounding guard region 117 may in some embodiments, cause N guard region 117 to become a strong cathode of an undesired parasitic thyristor, which may cause latch-up during certain conditions.

Accordingly, described herein are guard region configurations that are more efficient in providing current during certain conditions so as to prevent the sourcing of current from other devices of an integrated circuit and the undesirable consequences thereof.

Figure 3:
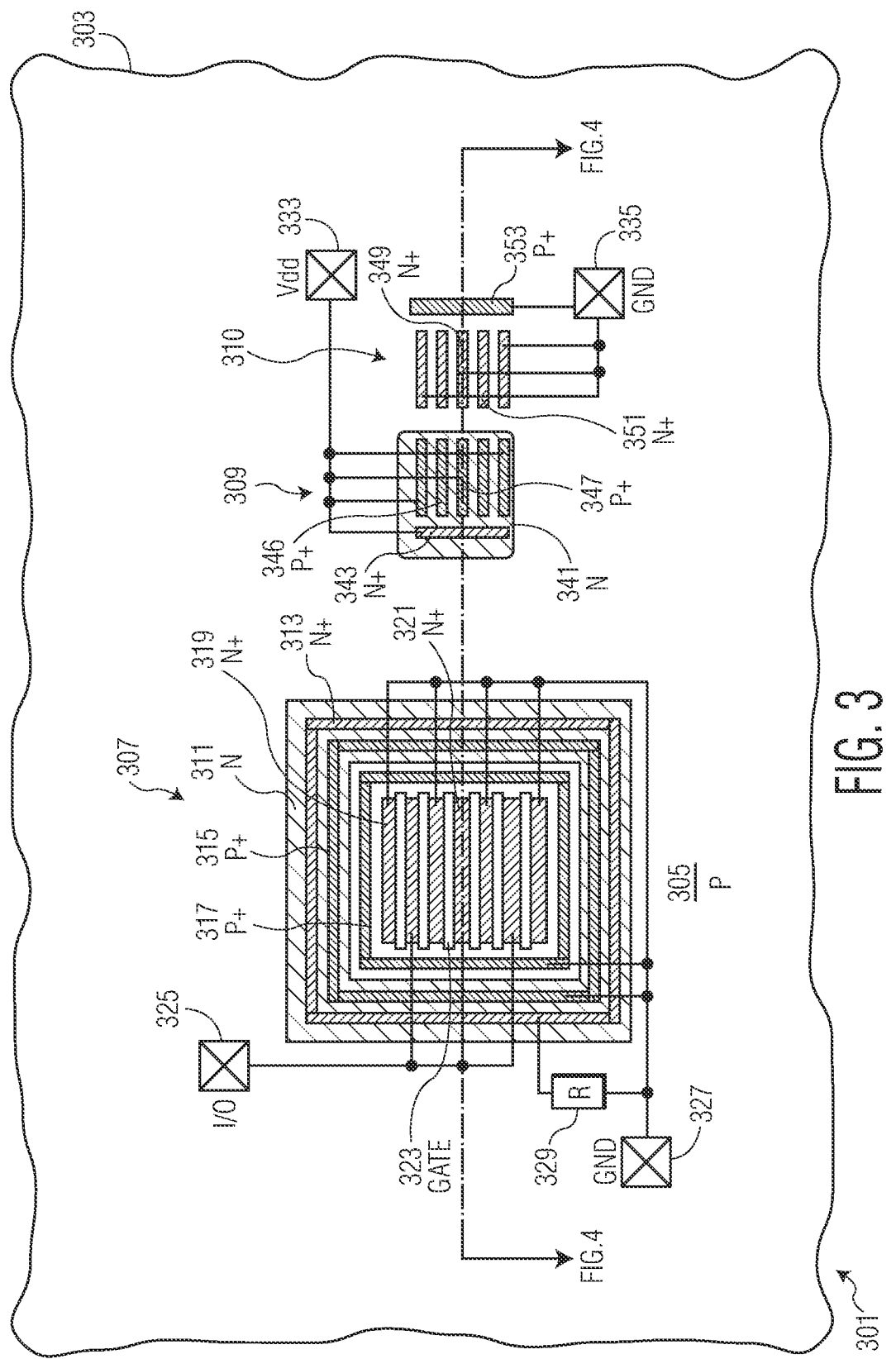
FIG. 3 is a partial top view of an integrated circuit according to one embodiment of the present invention.

FIG. 3 is a partial top view of an integrated circuit 301. The view of FIG. 3 shows semiconductor devices (NFET 307, PFET 309, and NFET 310) located in substrate 303 of integrated circuit 301. These semiconductor devices are utilized in circuits of integrated circuit 101, such as in a DC to DC power converter for example.

In one embodiment, substrate 303 includes semiconductor material (e.g., silicon, silicon germanium, silicon carbide, gallium nitride, other III-V semiconductor material) and may include dielectric structures e.g., buried oxide layers or shallow trench isolation (not shown). Substrate 303 may also include other semiconductor devices (not shown) located outside the view of FIG. 3. Substrate 303 includes a P layer region 305 that, in some embodiments, is epitaxially formed in-situ doped with P type dopants at a P– concentration level. In some embodiments, layer region 305 may be selectively implanted with P type ion dopants near the surface of substrate 303 to increase the net conductivity dopant concentration of an upper portion of layer region 305 to a P concentration level in selected areas. In other embodiments, P layer region 305 may be formed by the ion implantation of P type dopants in substrate 303. In some embodiments, substrate 303 may be in-situ doped with P type dopants at a P– concentration level where P layer region 305 represent a portion of the substrate.

In the embodiment shown, NFET 307 includes N+ source finger regions (with region 319 specifically identified) that are electrically connected to ground terminal 327 and N+ drain finger regions (with region 321 specifically identified) electrically connected to I/O terminal 325. The source finger regions 319 and drain finger regions 321 are in the top view of FIG. 3, shown as separated by gate structures 323, which are made of a gate material (e.g., poly silicon or metal) that are located directly over portions (not shown) of P layer region 105 and located laterally between the source regions 319 and drain regions 321 and serve as the channel regions of NFET 307. The biasing connections of gate structures 323 are not shown in FIG. 3. Source regions 319 and drain regions 321 are laterally surrounded by a P+ contact region 317 that is biased by ground terminal 327 for grounding P layer region 305 in the area surrounding NFET 307.

As shown in FIG. 3, PFET 309 includes an N well 341 with P+ source regions (with region 347 identified in FIG. 3) that are biased by VDD terminal 333. Well 341 also includes an N+ body contact region 343 that is biased by VDD terminal 333 and P+ drain regions (with region 346 identified). Not shown in FIG. 3 are the gate structures for PFET 309 located above substrate 303 over locations between the source regions (347) and the drain regions (346). Also not shown is the biasing for drain regions 346.

NFET 310 includes N+ source regions (with region 349 identified) located in P layer region 305 which are biased by ground terminal 335. NFET 310 also includes a P+ contact region 353 that is biased by ground terminal 335 and N+ drain regions (with region 351 identified). Not shown in FIG. 3 are the gate structures for NFET 310 located above substrate 303 over locations between the source regions (349) and the drain regions (351). The biasing for drain regions 351 are not shown in FIG. 3.

Integrated circuit 301 includes guard configuration regions in substrate 103 for providing isolation of currents from the regions of NFET 307. In the embodiment shown, the guard configuration regions include an N well ring 311 that laterally surrounds NFET 307. Located in and isolated by N well ring 311 is a P+ contact ring 315 that is biased by ground terminal 327. An N+ contact ring 313 is also located in well ring 311. Ring 313 is electrically coupled to ground terminal 327 through a resistive circuit 329. In one embodiment, resistive circuit 329 is a poly silicon resistor (similar to resistor circuit 803 in FIG. 8) located on substrate 303 at a region not shown in FIG. 3. In other embodiments, resistive circuit 329 includes a doped semiconductor region (similar to region 813 in FIG. 8) in substrate 303 at another region not shown in FIG. 3. In still another embodiment, resistive circuit 329 may be a transistor (similar to resistor circuit 805 in FIG. 8) whose gate is biased at a particular voltage to provide the desired resistive value between its source and drain. In some embodiments, resistive circuit 329 may include multiple resistors coupled in parallel at various locations around ring 313. In one embodiment, resistive circuit 329 provides a resistance value between 0.1-10 K ohms, but may be of other values in other embodiments.

Figure 4:
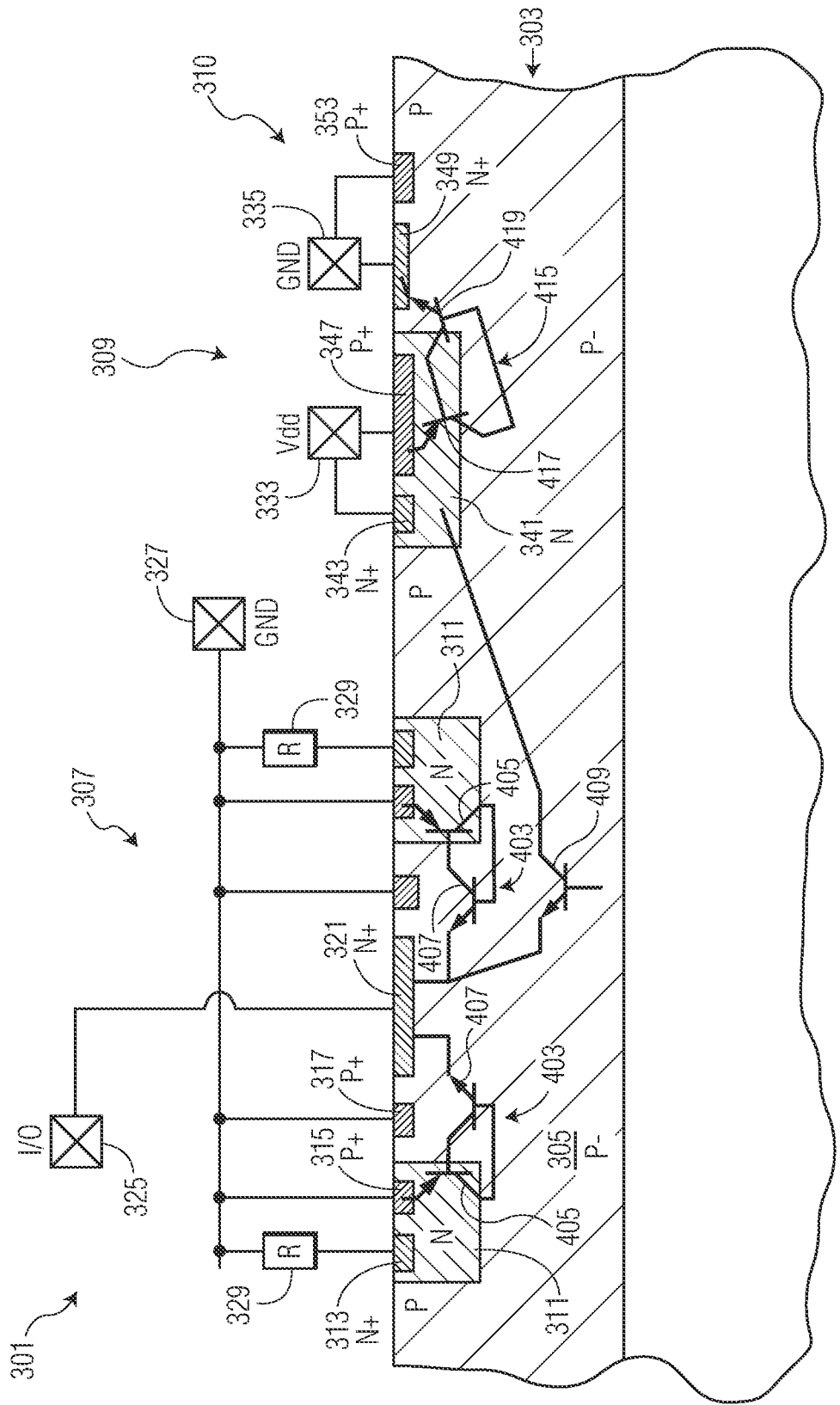
FIG. 4 is a partial cutaway sideview of the integrated circuit of FIG. 3.

FIG. 4 is a partially cutaway side view of integrated circuit 301 at the cross-section shown in FIG. 3. Shown as lines in FIGS. 3 and 4 are the various electrical connections from the terminals (325, 327) to the regions (e.g., 321, 317) in substrate 303. In one embodiment, these connections may be implemented with conductive interconnect structures and vias (e.g., made of copper, aluminum, tungsten) located in one or more interconnect layers (not shown) located over substrate 303. In some embodiments, the top surfaces of the regions of substrate 303 shown in FIGS. 3 and 4 may be selectively silicided for ohmic contact with the interconnects (not shown) at one or more locations. For example, referring to FIG. 3, the top surface of P+ ring 315 may be silicided where interconnects electrically connected to terminal 327 are electrically connected to the silicide at various locations around ring 315 to effectively bias all portions of ring 315. In other embodiments, polysilicon structures (not shown) may be located directly on top of and in electrical contact with the regions of substrate 303 where the top surface of the polysilicon is silicided for connection to interconnect structures.

Integrated circuit terminals 325, 327, 333, and 335 may be implemented as bumps, posts, or pads on integrated circuit 301. In some embodiments, integrated circuit 301 is encapsulated with an encapsulate e.g., molding compound (not shown) to form an integrated circuit package where integrated circuit 301 can be implemented in an electronic system such as an automobile control system, computer system, industrial control system, cellular phone, etc. The integrated circuit terminals would be connected to terminals (not shown) of the IC package (not shown). In one embodiment, NFET 307, PFET 309, and NFET 310 are used in a DC-DC power converter (not shown) where NFET 307 is a power transistor of the power converter. However, NFET 307, PFET 309, and NFET 310 may be used in other types of circuits.

P+ ring 315 is isolated in N guard ring 311. A first region (e.g., P+ ring 315) of a first conductivity type is isolated in a second region (e.g., N guard ring 311) of a second conductivity type if there is no physical semiconductor substrate path of a first conductively type from the first region to a location of the first conductivity type (e.g., P layer region 305) in the semiconductor substrate outside of the second region. The cross section of P+ ring 315 may be different and/or the doping concentration of the P+ ring may be different in other embodiments. In some embodiments, ring 315 may have a larger cross section, but a lower net P type doping concentration.

Referring back to FIG. 4, during some operations of integrated circuit 301 (e.g., during a negative stress test) where a negative voltage is applied to I/O terminal 325, a parasitic thyristor 403 of parasitic NPN transistor 407 and parasitic PNP transistor 405 may open in thyristor 403 to source current to the negatively biased I/O terminal 325 from terminal 327. The emitter of transistor 407 is drain region 321, the base is P layer region 305, and the collector is N ring 311. The emitter of transistor 405 is P+ ring 315, the base is N ring 311, and the collector is P layer region 305. With terminal 325 biased at a negative voltage (−1 V) during the stress test and P layer region 305 biased by terminal 327 through region 317 at ground, transistor 407 becomes forward biased and begins to conduct current from N+ ring 311. Because N+ ring 313 is coupled to ground terminal 327 through resistor circuit 329 and P+ ring 315 is electrically connected to ground terminal 327, the voltage of N ring 311 is pulled lower than the voltage of ring 315 (ground), which causes transistor 405 to become forward biased to pull current from terminal 327 to P layer region 305 to increase the voltage of P layer region 305 at that area. This increase in the voltage of P layer region 305 at that area acts to increase the conductivity of transistor 407 which increases the conductivity of transistor 405 in a thyristor configuration.

Based on the above thyristor action, most of the current pulled from terminal 325 is pulled from terminal 327 through thyristor 403 thereby reducing the amount of current pulled through transistor 409 (which is similar to transistor 143 of FIG. 1) in that thyristor 403 is more efficient in sourcing current than transistor 141 of FIG. 1. The regions of transistors 309 and 310 implement a thyristor 415 (which is similar to thyristor 145 of FIG. 1). Thyristor 415 includes parasitic PNP transistor 417 where P+ region 347 is the emitter, N well 341 is the base, and P layer region 305 is the collector and includes parasitic NPN transistor 419 where N+ region 349 is the emitter, P layer region 305 is the base, and N well 341 is the collector. PNP transistor 417 and NPN transistor 419 are similar to PNP transistor 147 and NPN transistor 149 of FIG. 1, respectively. Because the amount of current pulled through transistor 409 is significantly reduced due to thyristor 403, the probability of thyristor 415 turning on is greatly reduced. Thus, the latch-up risk from a conductive thyristor 415 (similar to that described above with respect to a conductive thyristor 145 of FIG. 1) is also greatly reduced. In some embodiments, because the voltage difference between terminals 325 and 327 after the negative stress test is less than approximately 1.2 volts, thyristor 403 will not be self-sustained and cause latch-up issues.

One advantage of the embodiment of FIGS. 3 and 4 is that the N guard region (N ring 311) is not grounded. A grounded N guard region may lead to latch-up issues in some embodiments where the N guard region may act as a strong cathode of a parasitic thyristor. Furthermore, another advantage with the embodiment of FIGS. 3 and 4 is that the N guard region (N ring 311) is not biased at VDD, which is not feasible in some circuits such as in a DC to DC power converter. Furthermore, in the embodiment of FIGS. 3 and 4, coupling ring 311 to ground terminal 327 through resistor circuit 329 may provide for a guard region configuration that does not include a floating region, which may be desirable in some embodiments.

Figure 5:
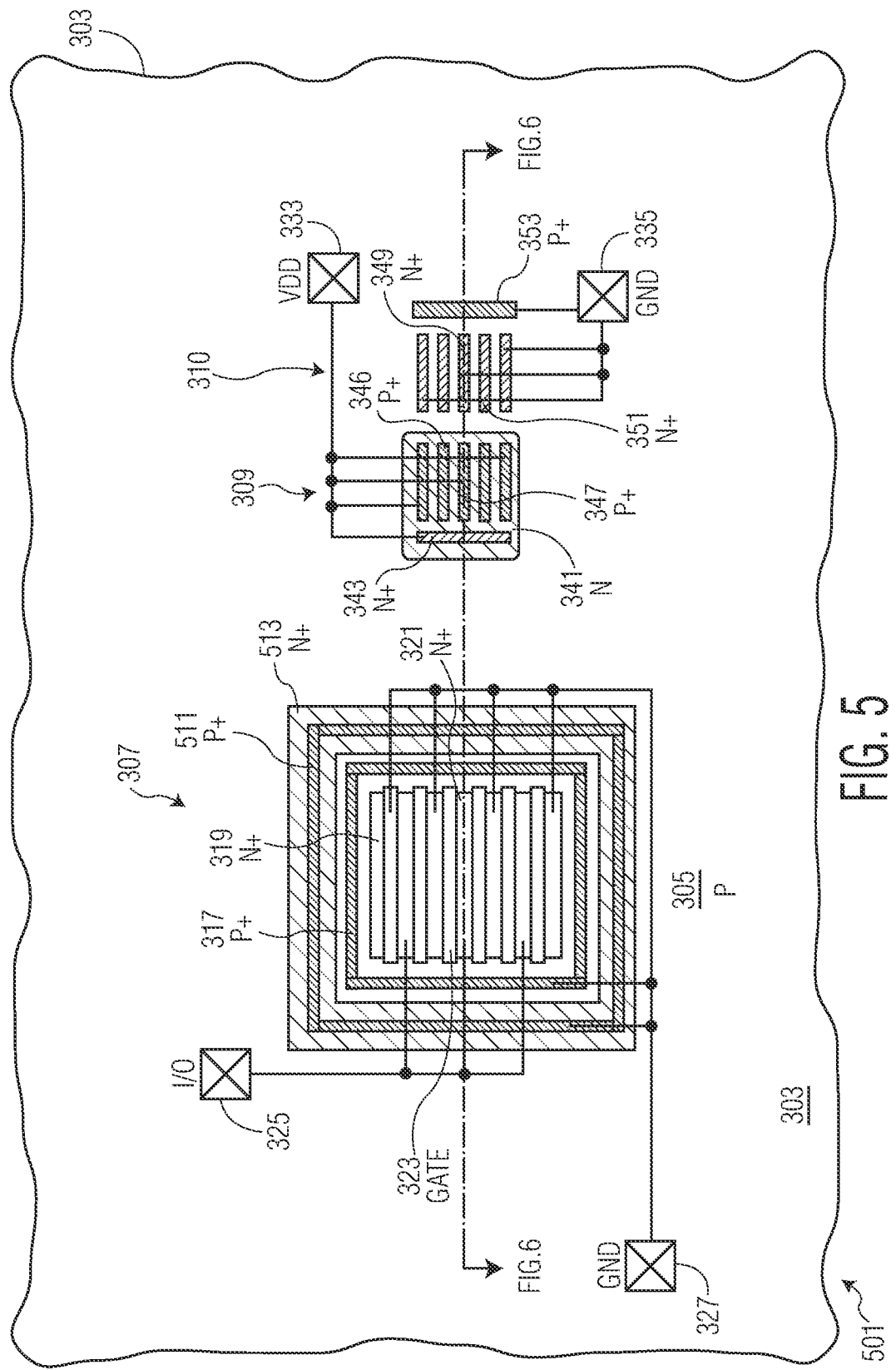
FIG. 5 is a partial top view of an integrated circuit according to another embodiment of the present invention.
Figure 6:
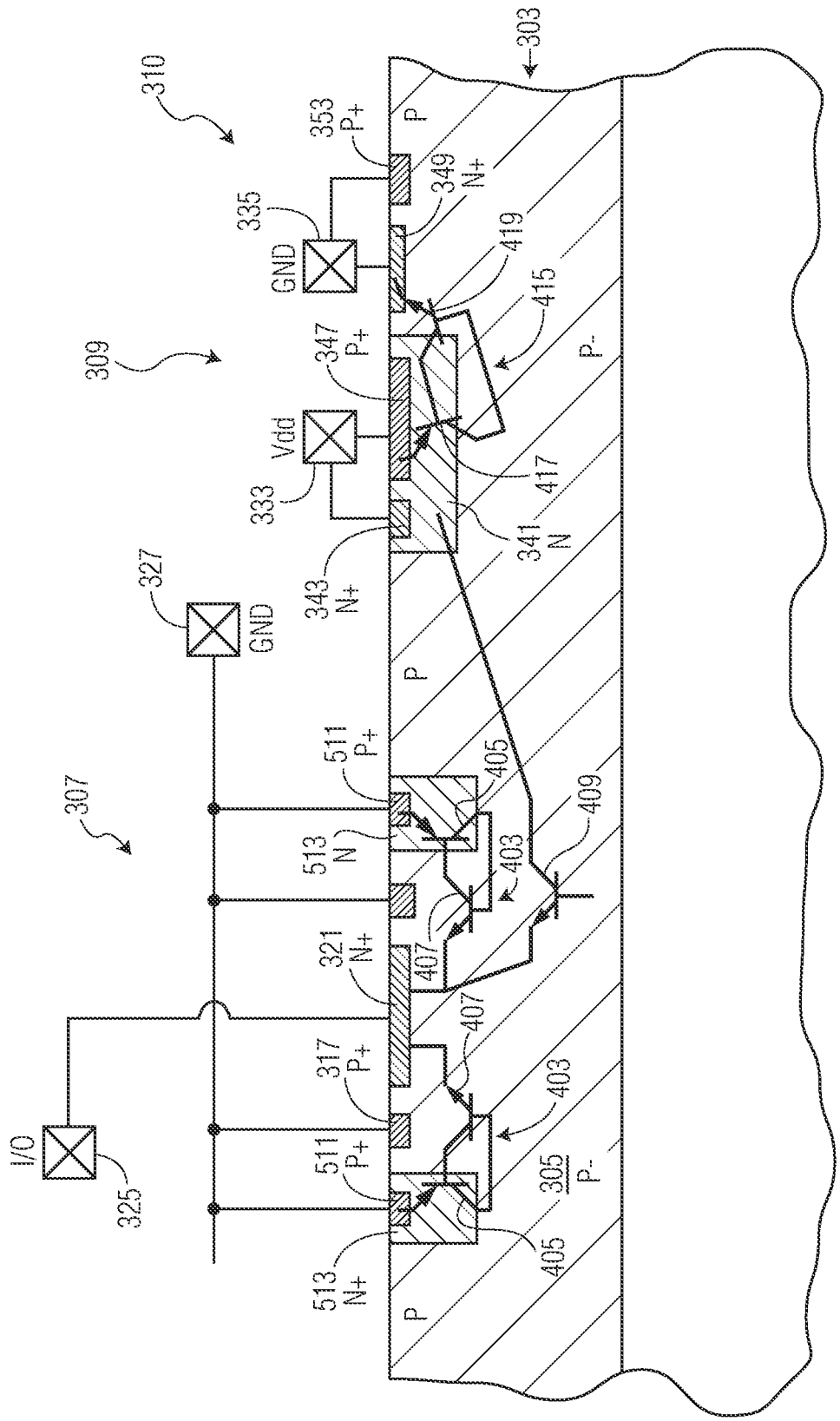
FIG. 6 is a partial cutaway sideview of the integrated circuit of FIG. 5.

FIG. 5 sets forth a partial top view and FIG. 6 sets for a partially cut away side view of an integrated circuit 501 according to another embodiment. The items in FIGS. 5 and 6 having the same reference numbers as in FIGS. 3 and 4 are similar. Integrated circuit 501 differs from integrated circuit 301 in that the N guard region (N well ring 513) is characterized as floating, whereas with integrated circuit 301, N ring 311 includes N+ ring 313 that is electrically coupled to ground terminal 327 through resistive circuit 329. A semiconductor region of a first conductivity type is characterized as floating when there is no semiconductor current path of the same conductivity type to a biasing conductive structure that when operating, could bias the region at a voltage.

Referring to FIG. 6, during a negative current stress test when drain region 321 is bias at a negative voltage and region 317 is biased at ground, transistor 407 begins to conduct which causes transistor 405 to conduct, activating thyristor 403 to where almost all of the current drawn by region 321 comes from terminal 327 through thyristor 403. Accordingly, little to no current flows through NPN transistor 409 wherein thyristor 415 is not activated. In some embodiments, having a floating ring 311 may allow for thyristor 403 to be more easily triggered where all current formed by the collection of electrons in ring 311 would contribute to the biasing of pnp transistor 405. In some embodiments, because N ring 311 is not grounded, latch-up issues associated with grounded N guard regions would not be present.

Figure 7:
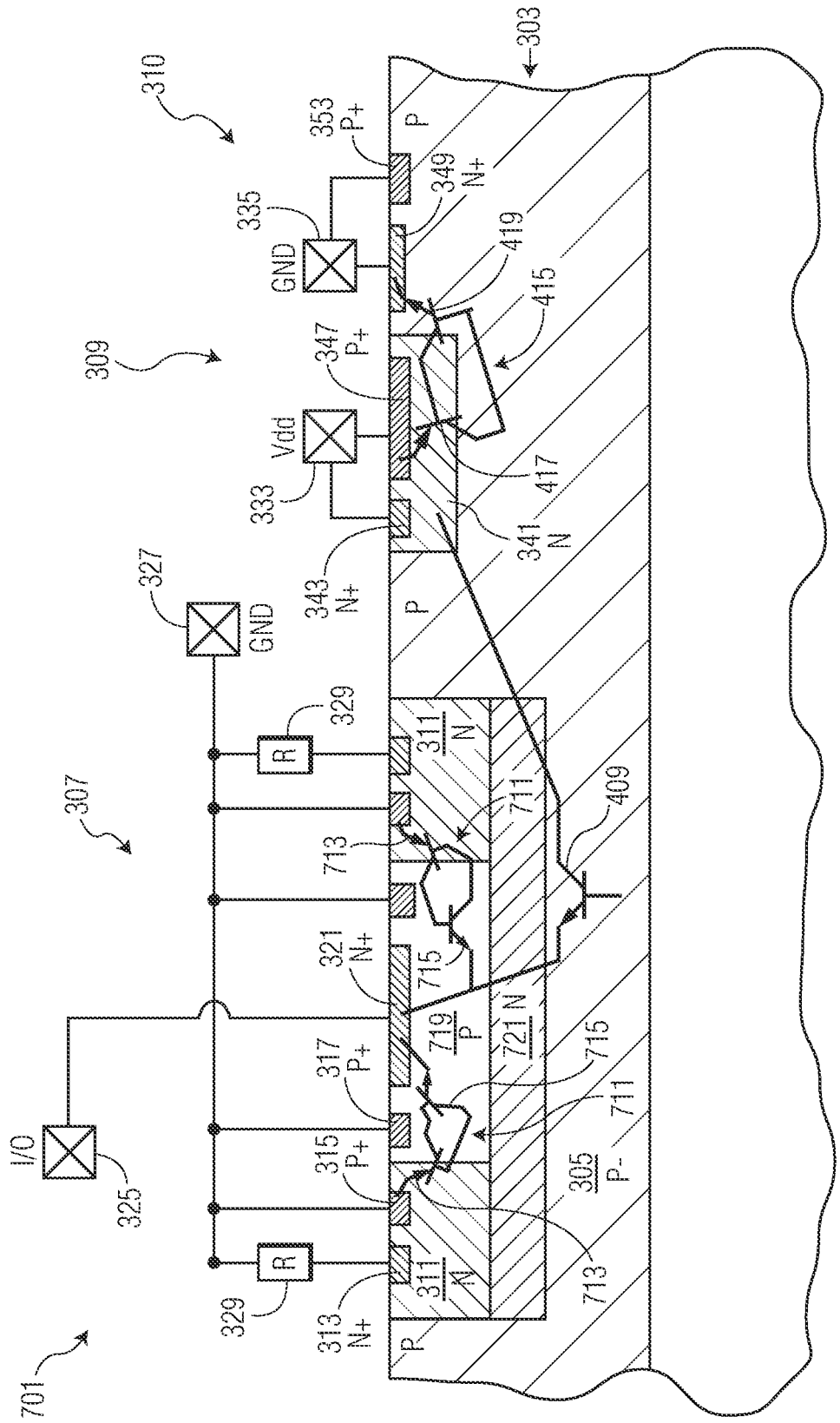
FIG. 7 is a partial top view of an integrated circuit according to another embodiment of the present invention.

FIG. 7 sets forth a partial cutaway side view of an integrated circuit 701 according to another embodiment. The items in FIG. 7 having the same reference numbers as in FIGS. 3 and 4 are similar. Integrated circuit 701 differs from integrated circuit 301 of FIG. 3 in that it includes a buried N layer 721 beneath NFET 307 that extends across and is in contact with the edges of N ring 311. Layer 721 defines a P well 719 which serves as the collector for parasitic PNP transistor 713 of thyristor 711 and the base of parasitic transistor 715 of thyristor 711. N ring 311 serves as the base of transistor 713 and the collector of transistor 715. P+ ring serves as the emitter of transistor 713 and drain region 321 serves as the emitter of transistor 715.

During a negative stress test where terminal 325 is biased at a negative voltage and terminal 327 is biased at ground, thyristor 711 opens in similar manner as thyristor 403 of FIG. 4 to source current from terminal 327 to terminal 325. One advantage of utilizing a buried N layer is that it provides additional isolation of the currents of N well 341, which reduces latch up risk between PFET 309 and NFET 310.

Figure 8:
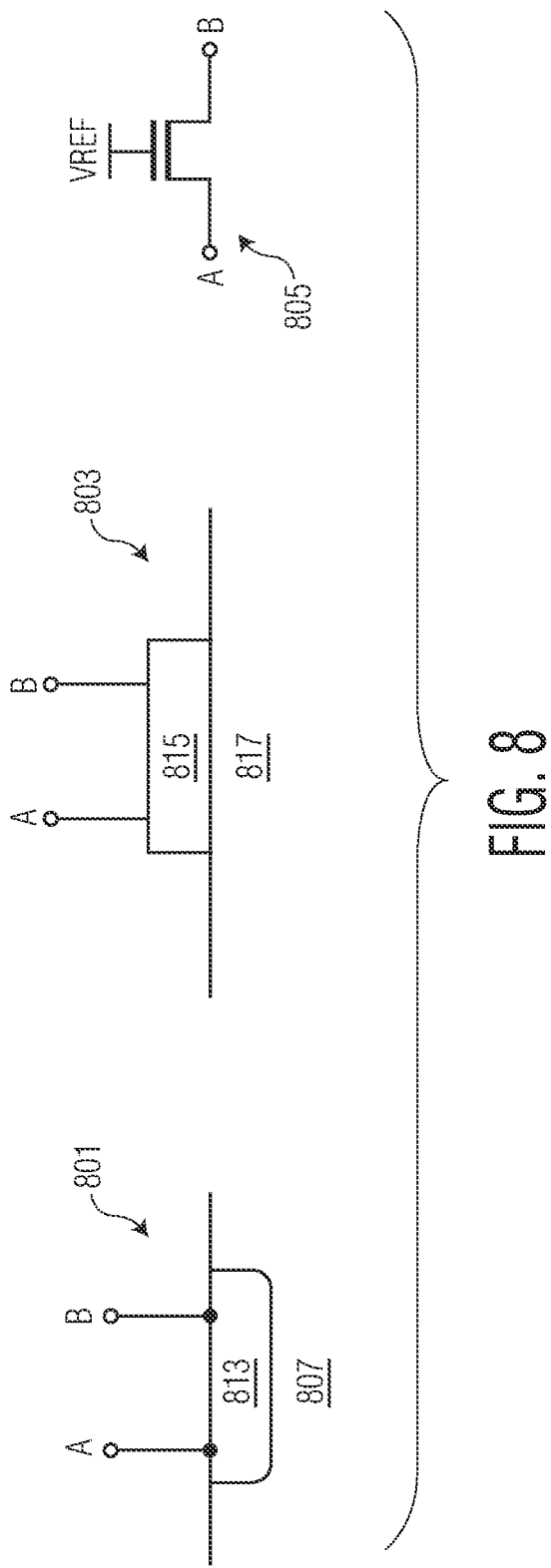
FIG. 8 shows three embodiments of a resistive circuit.

FIG. 8 shows three embodiments of a resistive circuit that can be used for resistive circuit 329. Resistive circuit 801 is implemented in a region 813 of substrate 807 and is doped with conductivity dopants having a concentration to provide the desired resistance between node A and node B. Resistive circuit 803 is implemented in a line of polysilicon 815 located over a substrate 817 wherein the polysilicon is doped with conductivity dopants to provide the desired resistance from node A to node B. Resistor circuit 805 includes an NFET biased at a voltage VREF to provide a desired resistance from node A and node B. Other types of resistive circuits can be used in other embodiments.

Other integrated circuits may have other regions and/or configurations in other embodiments. For example, although N well rings 311 and 513 have ring configurations, a guard region configuration in other embodiments may have other configurations. For example, the guard region configuration may be a line or partial ring located between NFET 307 and PFET 309. In other embodiments, NFET 310 and PFET 309 may have a guard region configuration at least partially surrounding their location Also, in some embodiments, NFET 307 may be in one voltage domain and PFET 309 and NFET may be in different voltage domain. In some embodiments, P+ ring 311 or 511 may be discontinuous. In some embodiments, more than one semiconductor device may be surrounded by a guard ring configuration. In some embodiments, a region shown in the figures may have a net doping concentration that varies across different parts of the region. For example, ring 311 may have a higher N type doping concentration at the top of the region than at the bottom. In other embodiments, other types of semiconductor devices such as e.g., poly capacitors, diodes, bipolar transistors, power transistors, or other types of transistors may be located in the position of NFET 307 or at the positions of PFET 309 and NFET 310. For example, NFET 307 may be an N+/P well ESD diode.

A gate is a control terminal for a FET and the drain and source regions are current terminals for a FET. A base is a control terminal for a bipolar transistor and the emitter and collector are current terminals for a bipolar transistor.

As disclosed herein, a first structure or region is "directly over" a second structure or region if the first structure or region is located over the second structure or region in a line having a direction that is perpendicular with the generally planar major side of the substrate. For example, in FIG. 7, region 321 is directly over layer 721. Region 347 is not directly over layer 721. As disclosed herein, a first structure or region is "directly beneath" a second structure or region if the first structure or region is located beneath the second structure region in a line having a direction that is perpendicular with the generally planar major side of the substrate. For example, in FIG. 7, layer 721 is directly beneath region 321. Layer 721 is not directly beneath region 347. One structure or region is "directly between" two other structures or regions in a line if the two structures or regions are located on opposite sides of the one structure or region in the line. For example, in FIG. 7, region 347 is located directly between ring 311 and region 353 in a line in the cut away side view of FIG. 7. Layer 721 is not located directly between ring 313 and region 353 in a line. A first structure or region is "directly lateral" to a second structure or region if the first structure or region and second structure or region are located in a line having a direction that is parallel with a generally planar major side of the substrate. For example, regions 343 and 353 are directly lateral to each other. Layer 721 is not directly lateral to region 353. One structure or region is "directly laterally between" two other structures or regions if the two structures or regions are located on opposite sides of the one structure or region in a line that is parallel with a generally planar major side of the substrate. For example, in FIG. 7, region 343 is located directly laterally between regions 321 and 353. A first structure or region laterally surrounds a second structure or region if the first structure or region surrounds the second structure or region in a line having a direction that is parallel with a generally planar major side of the substrate. For example, in FIGS. 3 and 4, ring 313 laterally surrounds region 321.

Features specifically shown or described with respect to one embodiment set forth herein may be implemented in other embodiments set forth herein.

In one embodiment, an integrated circuit includes a first semiconductor device including an N type region in a substrate of the integrated circuit. The N type region is configured to be biased by a first integrated circuit terminal. The integrated circuit includes a second semiconductor device including a second region located in the substrate and an N type guard region located in the substrate and including a portion located laterally between the N type region and the second region. The integrated circuit includes a P type guard region isolated in the N type guard region. The P type guard region is configured to be biased by a second integrated circuit terminal. The N type guard region is either electrically coupled to the second integrated circuit terminal through a resistive circuit or is characterized as floating.

In another embodiment, an integrated circuit includes a semiconductor device including an N type region in a substrate of the integrated circuit. The N type region is configured to be biased by a first integrated circuit terminal. The integrated circuit includes an N type guard region located in the substrate and laterally surrounding the N type region and includes a P type guard region isolated in the N type guard region. The P type guard region is configured to be biased by a second integrated circuit terminal. The N type guard region is either electrically coupled to the second integrated circuit terminal through a resistive circuit or is characterized as floating.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. An integrated circuit comprising:
a first semiconductor device including an N type region in a substrate of the integrated circuit, the N type region is configured to be biased by a first integrated circuit terminal;
a second semiconductor device including a second region located in the substrate;
an N type guard region located in the substrate and including a portion located laterally between the N type region and the second region;
a P type guard region isolated in the N type guard region, the P type guard region is configured to be biased by a second integrated circuit terminal;
wherein the N type guard region is either electrically coupled to the second integrated circuit terminal through a resistive circuit or is characterized as floating.

2. The integrated circuit of claim 1 wherein the N type guard region is electrically coupled to the second integrated circuit terminal through the resistive circuit.

3. The integrated circuit of claim 2 wherein the resistive circuit is characterized as a polysilicon resistor.

4. The integrated circuit of claim 2 wherein the resistive circuit includes a current path located in a doped semiconductor region of the substrate.

5. The integrated circuit of claim 2 wherein the resistive circuit includes a transistor whose control terminal is configured to be biased to provide a resistance between its current terminals.

6. The integrated circuit of claim 2 wherein the resistive circuit is configured to provide a resistance in a range of 0.1 kilo ohm to 10 kilo ohms.

7. The integrated circuit of claim 1 wherein the N type guard region is characterized floating.

8. The integrated circuit of claim 1 wherein the integrated circuit is configured that during a condition when a voltage of the first integrated circuit terminal is below a voltage of the second integrated circuit terminal by at least a first voltage difference, at least a portion of the N type guard region located adjacent to the P type guard region is at a lower voltage than the P type guard region.

9. The integrated circuit of claim 1 wherein the N type guard region is characterized as having a ring configuration and laterally surrounds the N type region, wherein the second region is located laterally outside of the N type guard region.

10. The integrated circuit of claim 9 wherein the P type guard region is characterized as having a ring configuration and laterally surrounds the N type region.

11. The integrated circuit of claim 1 wherein the first semiconductor device is characterized as an NFET device, wherein the N type region is characterized as a drain region of the NFET device.

12. The integrated circuit of claim 1 wherein the first semiconductor device is characterized as a power transistor for a DC-DC power converter.

13. The integrated circuit of claim 1 wherein:
the integrated circuit is configured that during a condition when a voltage of the first integrated circuit terminal is below a voltage of the second integrated circuit terminal by at least a first voltage difference, a parasitic NPN transistor in the substrate becomes conductive and a parasitic PNP transistor in the substrate becomes conductive to provide a path for current from the second integrated circuit terminal to the first integrated circuit terminal;
for the parasitic NPN transistor, the N type region is characterized as an emitter, a P type region of the substrate is characterized as a base, and the N type guard region is characterized as a collector;
for the parasitic PNP transistor, the P type guard region is characterized as an emitter, the N type guard region is characterized as a base, and the P type region is characterized as a collector.

14. The integrated circuit of claim 1 comprising:
a buried N type region located directly below the first semiconductor device and in contact with the N type guard region.

15. The integrated circuit of claim 1 wherein the second integrated circuit terminal is characterized as a ground terminal.

16. An integrated circuit comprising:
a semiconductor device including an N type region in a substrate of the integrated circuit, the N type region is configured to be biased by a first integrated circuit terminal;
an N type guard region located in the substrate and laterally surrounding the N type region;
a P type guard region isolated in the N type guard region, the P type guard region is configured to be biased by a second integrated circuit terminal;
wherein the N type guard region is either electrically coupled to the second integrated circuit terminal through a resistive circuit or is characterized as floating.

17. The integrated circuit of claim 16 wherein the N type guard region is electrically coupled to the second integrated circuit terminal through the resistive circuit.

18. The integrated circuit of claim 16 wherein the N type guard region is characterized floating.

19. The integrated circuit of claim 16 wherein the P type guard region laterally surrounds the N type region.

20. The integrated circuit of claim 16 comprising:
a buried N type region located directly below the first semiconductor device and in contact with the N type guard region.

* * * * *